US006723489B2

(12) United States Patent
Aburano et al.

(10) Patent No.: US 6,723,489 B2
(45) Date of Patent: Apr. 20, 2004

(54) PRINTING FORM PRECURSORS

(75) Inventors: Maru Aburano, Gunma-ken (JP); Shoichi Hotate, Saitama-ken (JP); Shinji Shimizu, Gunma-ken (JP); Yasuhiko Kojima, Saitama-ken (JP)

(73) Assignee: Kodak Polychrome Graphics LLP, Norwalk, CT (US)

( * ) Notice: Subject to any disclaimer, the term of this patent is extended or adjusted under 35 U.S.C. 154(b) by 95 days.

(21) Appl. No.: 10/060,470

(22) Filed: Jan. 30, 2002

(65) Prior Publication Data

US 2003/0152847 A1 Aug. 14, 2003

(51) Int. Cl.[7] .............................. G03F 7/38; G03F 7/40

(52) U.S. Cl. .................... 430/270.1; 430/302; 430/269; 430/944; 430/300; 101/453; 101/467

(58) Field of Search .............................. 430/270.1, 302, 430/944, 269, 300; 101/453, 467

(56) References Cited

U.S. PATENT DOCUMENTS 4,708,925 A 11/1987 Newman ................. 430/270.1
5,491,046 A 2/1996 DeBoer et al. ............. 430/302
6,251,559 B1 * 6/2001 Huang et al. ............ 430/270.1

FOREIGN PATENT DOCUMENTS

| | | |
|---|---|---|
| EP | 0823327 | 2/1998 |
| EP | 0652483 | 5/1998 |
| EP | 1074386 | 2/2000 |
| EP | 0819980 | 5/2000 |
| EP | 1074889 | 2/2001 |
| JP | 11119414 | 9/1999 |
| JP | 20003031 | 1/2000 |
| WO | 9739894 | 10/1997 |
| WO | 9901796 | 1/1999 |
| WO | 9908879 | 2/1999 |
| WO | 9921715 | 5/1999 |
| WO | 0029214 | 5/2000 |

* cited by examiner

*Primary Examiner*—Cynthia Hamilton
(74) *Attorney, Agent, or Firm*—Faegre & Benson LLP

(57) ABSTRACT

Lithographic printing form precursors comprising positive working polymeric coatings on substrates may during storage or transportation undergo undesirable changes in their imaging properties. It has been found that acceptable properties can be restored by carrying out a heat treatment which involves a relatively short heating stage followed by accelerated cooling.

21 Claims, 1 Drawing Sheet

PRINTING FORM PRECURSORS

BACKGROUND OF INVENTION

1. Field of the Invention

This invention relates to methods of providing printing form precursors. The invention relates further to such precursors per se, and to their use. The invention also relates to the reclaiming of printing form precursors which do not meet an acceptable specification, to bring such precursors within specification.

This invention relates primarily to positive working printing form precursors. In such precursors the coating after imagewise exposure becomes more soluble in the exposed areas than in the non-exposed areas, in a chemical developer. The exposed areas are selectively dissolved away and only the remaining areas of the coating are ink-receptive.

2. Background Information

For many years the coatings used for positive working printing form precursors comprised alkali soluble resins and naphthoquinone diazide (NQD) derivatives, either as functional groups on the resins or as separate compounds. These coatings are imaged using flood UV radiation, delivered via a mask. These coatings have good stability over time.

In recent years there has been a move towards printing form precursors which can be imaged using IR lasers which have digital output and are computer-controlled, allowing the imaging step to be controlled by an operator from a computer screen.

The use of a digital process employing IR lasers has important advantages over the earlier UV methods but there is the disadvantage that the properties of the IR-sensitive printing form precursors tend not to be as stable over time, as those of the UV-sensitive precursors.

Thus, it has been observed that with many IR-sensitive positive working printing form precursors there may be a reduction in "sensitivity" over time, after the coating has been applied to a substrate and dried, this effect being the result of reduced developer solubility of the unexposed coating with time prior to exposure. In this specification "sensitivity" is referred to in the context of the entire process of exposure and development. It does not refer only to the matter of how the areas of the coating which are exposed react to that exposure. In the lithographic printing art this "sensitivity" is sometimes called "operating speed", or the skilled person may say that the coating has become "slower".

It is difficult for an operator to adjust for precursors whose sensitivity has reduced substantially (i.e. outside a defined specification). Therefore it would be desirable to have a method which improves precursors having positive working heat or IR-sensitive coatings, such that an operator has a more consistent and stable product.

Lithographic printing form precursors which can be imaged using IR lasers are described in WO 97/39894. Fundamentally the change in solubility on imaging using IR lasers are caused by heat not by chemical breakdown ("photolysis") in the coating. The heat is produced by the interaction of the IR radiation and IR absorbers present in the coatings, and acting as light-to-heat converters.

In order to provide IR and/or heat sensitive precursors with more even properties over time a stabilizing heat treatment was described in WO 99/21715. Good results are achieved when a positive working precursor is given a "conditioning" heat treatment at a moderate temperature, for example 40–90° C., for an extended period, for example at least 4 hours. In the method described the heat treatment is applied to a precursor or a packet of 13 precursors.

In EP-A-1074889 there is described a related method to that of WO 99/21715, in which the precursor undergoes a "conditioning" heat treatment step under conditions which inhibit the removal of moisture from the precursor. One method of inhibiting the removal of moisture from a precursor during the "conditioning" heat treatment is to wrap the precursor in a water-impermeable sheet material; another is to carry out the heat treatment in a non-drying environment, for example a humidity controlled oven.

In the method of EP-A-1074889 the "conditioning" heat treatment step is similar to that described in WO 99/21715, in that it preferably employs an elevated temperature for an extended period; for example 40–90° C. for at least 4 hours. The conditioning heat treatment may be carried out on a stack of precursors.

Thus WO 99/21715 emphasizes the importance of the conditioning heat treatment step. EP-A-1074889 does likewise, and additionally emphasizes the importance of moisture during the conditioning. Neither focuses on the cooling of the heat treated precursors.

EP-A-1074386 describes a process in which a printing form precursor undergoes a heat treatment regime which includes a conditioning heat treatment as described above, followed by the controlled slow cooling of the precursor. The controlled slow cooling should take at least 1 hour, and most preferably at least 6 hours. The cooling rate should not exceed 1° C./min, and most preferably should not exceed 0.2° C./min. The experiments described in EP-A-1074386 are all on individual precursors, and in practice the controlled slow cooling involves allowing them to cool in the conditioning oven, which had been switched off. Additionally, the possible application of the invention of EP-A-1074386 to precursor coils or stacks of precursors is described. Controlled slow cooling of a precursor coil or a stack of precursors is defined as cooling under conditions such that heat is lost from the coil or stack more slowly than if the same coil or stack were cooled under ambient conditions.

It is an object of the present invention to provide a heat treatment which leads to printing form precursors with good properties, in an expeditious manner.

It is a further object of the present invention to reclaim off-specification printing form precursors efficiently.

SUMMARY OF THE INVENTION

This invention is directed to a method of preparing a printing form precursor and such a precursor, the method comprising:

(a) providing an imageable coating on a substrate, wherein the coating comprises a positive working polymeric composition;

(b) subjecting the precursor to a heat treatment at an elevated temperature; and (c) accelerating the cooling of the precursor.

This invention is also directed to a method of improving the imaging characteristics of a thermally imageable lithographic printing form precursor having degraded imaging characteristics, the method comprising:

(a) heating the thermally imageable precursor to an elevated temperature in the range of 45–110° C.; and (b) accelerating the cooling of the heated precursor to 30° C. or below.

This invention is also directed to a method of treating a printing form precursor, the method comprising:

(a) providing a precursor comprising a heat imageable coating on a substrate, the coating comprising a positive working polymeric composition which comprises a polymer having hydroxyl groups, an insolubilizer which acts to inhibit the dissolution of the coating in a developer prior to heat imaging but not after heat imaging, and a radiation absorbing compound able to absorb electromagnetic radiation in the range 600 to 1400 nm and covert the radiation to heat;

(b) heating the precursor, in the form of an individual precursor or a precursor web or in a packet, is subjected to an elevated temperature for a period to exceeding 5 hours; and (c) accelerating cooling of the precursor to bring the precursor temperature to 30° C. or below in less than 1 hour.

This invention is also directed to a method of treating a printing form precursor included in a stack, the method comprising:

(a) providing a stack comprising a precursor having a heat imageable coating on a substrate, the coating comprising a positive working polymeric composition which comprises a polymer having hydroxyl groups, an insolubilizer which acts to inhibit the dissolution of the coating in a developer prior to heat imaging but not after heat imaging, and a radiation absorbing compound able to absorb electromagnetic radiation in the range 600 to 1400 nm and convert the radiation to heat;

(b) subjecting the stack to an elevated temperature for a period not exceeding 8 hours; and (c) accelerating the cooling of the stack to bring the stack temperature to 30° C. or below over a period not exceeding 8 hours.

This invention is also directed to a method of producing a lithographic printing form bearing a pattern in a coating thereon and such a printing form, the method comprising:

(I) preparing a precursor by a method comprising:
  (a) providing an imeagable coating on a substrate, wherein the coating comprises a positive working polymeric composition,
  (b) subjecting the precursor to a heat treatment at an elevated temperature, and
  (c) accelerating the cooling of the precursor;

(II) imagewise exposing the coating of the precursor; and (III) contacting the exposed coating with an aqueous developer thereby removing imagewise exposed regions of the coating.

Other aspects of this invention will be apparent from the detailed description set forth below.

DETAILED DESCRIPTION OF THE INVENTION

Figure 1:
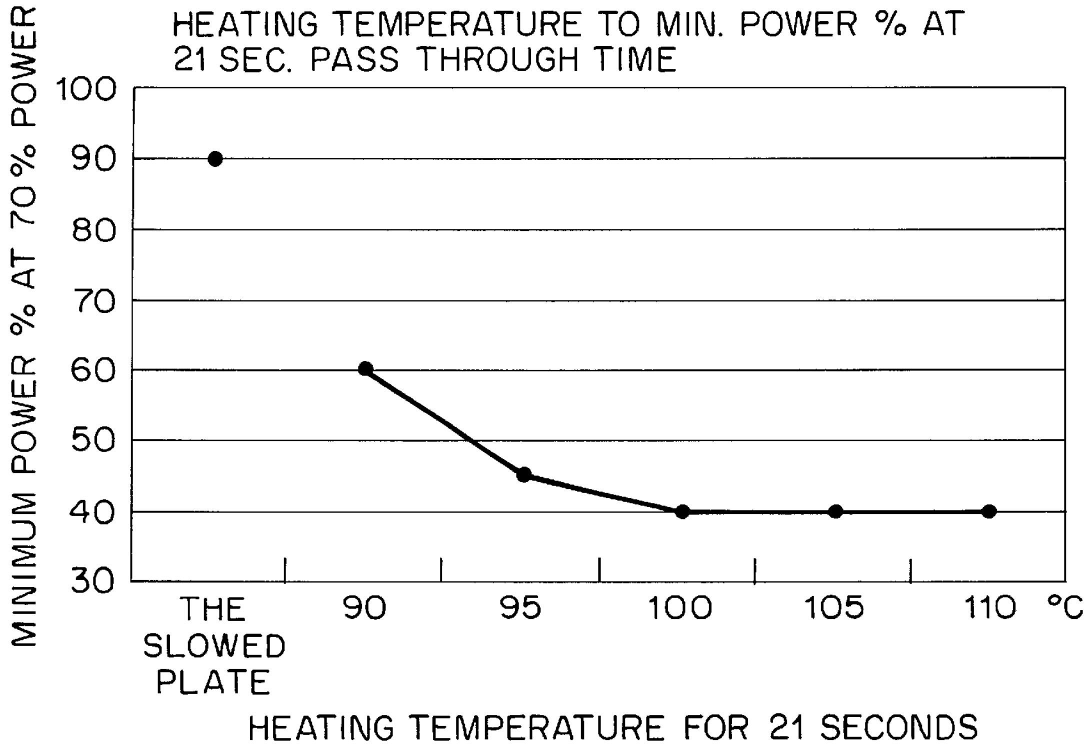
FIG. 1 depicts the relationship between minimum image setter power (as a % of maximum power) vs. heating temperature (for 21 seconds) to obtain a clear image.

In accordance with a first aspect of the present invention there is provided a method of providing a printing form precursor having an imageable coating on a substrate, the coating comprising a positive working polymeric composition, wherein the method includes a heat treatment procedure which comprises: (i) subjecting the precursor to an elevated temperature; and (ii) accelerated cooling of the precursor.

The method may be applied to an individual precursor or to a precursor in web form (also known as a "precursor web"), and in such embodiments the accelerated cooling may be achieved by subjecting the precursor, initially at the elevated temperature, to a fluid, preferably air. The fluid may be at a temperature less than the precursor at all times in the cooling phase. Preferably, however, fluid at sub-ambient temperature or, most preferably, at ambient temperature is used during the cooling phase. The fluid may be still or may be blown over the precursor, and/or the precursor may be moved within the fluid. Materials such as dry ice and liquid nitrogen may be employed. However, whatever cooling method is used such a precursor is preferably cooled to a temperature of 30° C. or less in less than 1 hour, preferably in not more than 50 minutes, more preferably in not more than 30 minutes, and most preferably in not more than 20 minutes. This is in contrast to the method of EP-A-1074386 in which individual precursors are cooled in an oven for at least 1 hour, and preferably for longer. As discussed and used herein, the terms "precursor web" or "precursor in web form" refer to the strip of precursor material (e.g. aluminum) which is manufactured and subsequently cut to obtain a plurality of individual precursors which are subsequently treated to obtain an imaging element such as a printing plate.

The method may be applied to packets of precursors—by which we mean small stacks of not more than 50 precursors, including any dummy precursors present (often placed at the top or bottom of the packets). In such embodiments accelerated cooling may also be achieved by subjecting the packets, initially at the elevated temperature, to a fluid, preferably air. The fluid may be at a temperature less than the packet at all times in the cooling phase. Preferably fluid at sub-ambient temperature or, most preferably at ambient temperature is used during the cooling phase. The fluid may be still or may be blown over the packet. Materials such as dry ice and liquid nitrogen may be employed. The packets may be separated into individual precursors for cooling (which may then be cooled as described above for individual precursors) but whatever the cooling method used—for example even when a packet is itself cooled in ambient, still air—the cooling is reasonably fast, such that the packet is cooled to a temperature of 30° C. or less in, preferably in not more than 5 hours, most preferably not more than 1 hour.

The method may be applied to a stack of precursors—by which we mean more than 50 precursors and in some embodiments up to 500 precursors, or up to 1000 precursors. A stack may also contain more than 1000 precursors. Cooling will be slower due to the thermal inertia of the stack, but benefit may still be obtained by using accelerated cooling. In such cases accelerated cooling means cooling more rapidly than is achieved by merely placing the stack in a coolant fluid. To this end a coolant fluid may be conveyed over the stack; and/or a chamber in which the stack is located (which may be the oven used to subject the stack to the elevated temperature) may be actively cooled; and/or the stack may be exposed to a chilled coolant fluid; and/or the stack may be separated into smaller stacks, packets or individual precursors at the start of cooling, and then cooled as described above for individual precursors and packets. Whatever cooling method is—for example even when a stack is itself cooled in ambient, still air—the cooling is reasonably fast, such that the stack is cooled to a temperature of 30° C. or less in, preferably, not more than 8 hours, most preferably in not more than 4 hours.

In relation to a precursor, precursor web, packet or stack, preferably its temperature is brought to 30° C. or below at least 20% more quickly than would be achieved by placing it in ambient, still air, and preferably at least 50% more quickly.

In the heat treatment procedure the precursor is brought to, and in certain embodiments held at, the elevated temperature, prior to the accelerated cooling. The range of effective conditions, and the optimal conditions to achieve a substantially constant sensitivity over time, and at a practicable level, will vary from case to case, and can be determined by using well known techniques, such as trial and error, as will be well understood by those skilled in the art. Without wishing to be bound by any one theory it is believed that a suitable heat treatment accelerates the formation of a stable network structure within the composition. If the elevated temperature is too low the time required for this stable network structure to form is too long to be practicable. Furthermore in relation to the minimum suitable temperature, the elevated temperature should desirably not be less than that which the precursor might typically be subjected to in transit or in storage, otherwise changes in sensitivity may occur. Consequently, it is preferred to carry out the heat treatment to bring the precursor or precursors to a temperature of at least 40° C., preferably at least 45° C., most preferably at least 50° C. As regards the upper limit, it is believed that at too high a temperature the time for which the heat treatment should be carried out to obtain a desired level and stability of sensitivity is likely to be overly critical, and that even when the sensitivity is adequately stable, it is likely to be too low to be of use. Again, well known techniques can easily be used to make this determination, but it is preferred that the precursor or precursors be subjected to a temperature not in excess of 110° C., preferably not in excess of 90° C., most preferably not in excess of 80° C. Although we do not wish to be bound by any theory we believe that, in general, heat treatments in which the maximum temperature reached by the precursor or precursors does not exceed its glass transition temperature (Tg) (as measured by differential scanning calorimetry (DSC) at a heating rate of 10° C./minute) are preferred as such heat treatments may be carried out on a packet or stack of precursors, and are therefore efficient.

Temperatures in the range 50–70° C., reached by the precursor or precursors, are particularly preferred in the method of the present invention, at least when the compositions comprise phenolic resins, such as novolaks.

The time for the heat treatment can also be determined by well known techniques, as will be well understood by those skilled in the art. Trial and error is one possible technique. However in the case of individual precursors and precursor in web form the time suitably does not exceed 8 hours, and preferably does not exceed 4 hours. Most preferably it does not exceed 1 hour. In certain favoured embodiments it is "flash heated" as it is conveyed through a heating zone in a machine, over a period of no more than 5 minutes, and sometimes less than 2 minutes.

In the case of packets or stacks the heating time must take account of the thermal inertia of these bodies. Nevertheless, it appears to be advantageous for the heating time to be lower than is suggested by the prior art, discussed above. Preferably the heating time does not exceed 20 hours, more preferably the heating time does not exceed 12 hours, and most preferably the heating time does not exceed 8 hours. In the method of the present invention the requirement appears to be for each precursor to reach the oven temperature, preferably not for it to undergo a prolonged "elevated temperature soak".

When stacks are used preferably they have at last 300 precursors, more preferably at least 500 precursors.

In this specification when we mention that a precursor, packet or stack is cooled to a temperature of 30° C. or below we mean that the whole of the respective precursor, packet or stack is cooled to a temperature of 30° C. or below.

The lack of need for a prolonged "elevated temperature soak", and the accelerated cooling, are aspects of the invention which are in contrast to the teaching of the prior art, discussed above.

It has been found that by carrying out a heat treatment procedure of the present invention enables the obtaining of coatings having improved properties. In particular, precursors whose sensitivity is off-specification may be brought back to specification. This is useful to reclaim precursors which are off-specification due to manufacturing error, drift in properties over a period of time due to incorrect handling, or error by an operator during exposure or handling of the precursor.

In accordance with a second aspect of the present invention there is provided a method of reclaiming a precursor having a defective imageable coating on a substrate, the coating comprising a positive working polymeric composition, wherein the method includes a heat treatment procedure which comprises subjecting the precursor to an elevated temperature followed by the accelerated cooling of the precursor.

In accordance with a third aspect of the present invention there is provided a method of treatment of a printing form precursor, suitably to give the precursor improved performance during subsequent heat imaging, with the precursor being in the form of an individual precursor or a precursor web, or in a packet, the precursor having a heat imageable coating on a substrate, the coating comprising a positive working polymeric composition which comprises a polymer having hydroxyl groups, an insolubilizer which acts to inhibit the dissolution of the coating in a developer prior to heat imaging but not after heat imaging, and a radiation absorbing compound able to absorb electromagnetic radiation entirely or predominantly in the range 600 to 1400 nm and convert the radiation to heat, the method comprising a heat treatment procedure in which the precursor is subjected to an elevated temperature for a period not exceeding 5 hours, followed by accelerated cooling to bring its temperature to 30° C. or below in less than 1 hour.

In accordance with a fourth aspect of the present invention there is provided a method of treatment of a printing form precursor, the precursor being in a stack, the precursor having a heat imageable coating on a substrate, the coating comprising a positive working polymeric composition which comprises a polymer having hydroxyl groups, an insolubilizer which acts to inhibit the dissolution of the coating in a developer prior to heat imaging but not after heat imaging, and a radiation absorbing compound able to absorb electromagnetic radiation entirely or predominantly in the range 600 to 1400 nm and convert the radiation to heat, the method comprising a heat treatment procedure in which the stack is subjected to elevated temperature for a period not exceeding 8 hours, followed by accelerated cooling to bring its temperature to 30° C. or below over a period not exceeding 8 hours.

Preferably the stack is subjected to a coolant fluid below ambient temperature and/or a coolant fluid flow. Alternatively or additionally, the stack may be separated into smaller stacks, individual precursors or packets.

It has been found that the coating may be rendered more resistant to undesired attack by a developer in non-imaged regions. Without wishing to be bound by any one theory, it is believed that the heat treatment procedure of the invention aids the formation of a stable network structure within the coating, and that this is a key factor in achieving both benefits mentioned above.

If desired the method may employ conditions which inhibit the removal of moisture from the precursor or precursors. The measures described in EP-A-1074889, incorporated herein by reference, may be employed. Such measures may be employed at the elevated temperature stage or at the accelerated cooling stage, or both.

It will be appreciated that an aim of the invention is both to render the sensitivity (as previously described) of the coating within the specification defined for the precursor, and stable over time. The latter is suitably assessed over a period of time which is the longest interval likely, between the heat treatment procedure and the use of the precursor by a customer. It is expected that one year is a suitable period of time for this assessment. In absolute terms, preferably the heat treatment is such that the sensitivity reduction in a given developer over a one-year period after the heat treatment does not exceed 15%; and preferably does not exceed 10%. The invention has the further, and allied, benefit, obtained immediately after the heat treatment has been carried out, that the coating is rendered more developer resistant prior to imaging and, after imaging, in non-imaged areas. This leads to a way of assessing the effectiveness of the heat treatment immediately thereafter: desirably it causes a substantial increase in the time required to dissolve the non-imaged coating in a developer. By "substantial increase" as used herein, it is meant that the increase is at least 50% longer, preferably at least 100% longer, more preferably at least 200% longer. In practice, increases of 300% or more can be achieved by methods of the invention, compared with corresponding compositions which have not undergone a suitable heat treatment. The reference developer for those preferred embodiments requiring an aqueous developer is a 14 wt % solution of sodium metasilicate in water, and that the reference temperature is 20° C. That is not to say that such a developer and temperature must be used in practical imaging and development methods applied by customers. It is believed this test, which looks at a property which is itself of importance, is also a useful inferential test as regards stability over time; i.e. that precursors which perform well in this test are likely to perform well over time.

Thus, preferably the heat treatment is such that the developer solubility of the non-imaged coating is at or near (suitably within 10% of) the minimum which can be achieved by the method, for that coating, across substantially the whole of the imageable surface of the heat treated precursor. Without wishing to be bound by any one theory, it is believed that there is a minimum solubility of the non-imaged coating, which the method can achieve for a given composition.

A further object of the present invention is that the sensitivity of the preferred coatings should be at a practicable level, after the heat treatment; suitably no more than 600 $mJcm^{-2}$, preferably no more than 400 $mJcm^{-2}$, most preferably no more than 250 $mJcm^{-2}$, and especially no more than 200 $mJcm^{-2}$.

Preferred coatings are those which after imaging are soluble in aqueous developers.

Many polymeric coatings show changes in their performance over time, and may be improved by the heat treatment step of the invention. Examples of polymers which may be present in a coating include phenolic resins, poly (hydroxystyrenes) and polyacrylic resins, as homopolymers, copolymers or terpolymers. Preferably such a polymeric coating includes a polymer having hydroxyl groups. Preferably the coating contains at least 20%, more preferably at least 50%, most preferably at least 70%, of such a resin, or of such resins in total, by weight on total weight of the coating.

Particularly useful phenolic resins in this invention are condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. Dependent on the preparation route for the condensation a range of phenolic materials with varying structures and properties may be formed. Particularly useful in this invention are novolak resins, resole resins and novolak/resole resin mixtures. Most preferred are novolak resins. The type of catalyst and the molar ratio of the reactants used in the preparation of phenolic resins is well known to those skilled in the art, and determines the molecular structure and therefore the physical properties of the resin. An aldehyde: phenol ratio between 0.5:1 and 1:1, preferably 0.5:1 to 0.8:1 and an acid catalyst is used to prepare novolak resins.

Examples of suitable novolak resins have the following general structure:

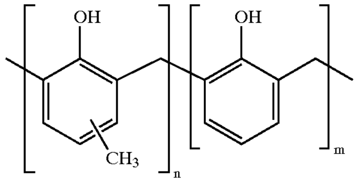

where the ratio of n:m is in the range of 1:20 to 20:1, preferably 3:1 to 1:3. In one preferred embodiment n=m. However, in certain embodiments n or m may be zero. Novolak resins suitable for use have a molecular weight in the range of about 500–20,000, preferably in the range of about 1000–15,000, say about 2500–10,000.

Other polymers suitable for inclusion in the composition, notably in admixture with a phenolic resin, preferably a novolak resin, include: poly-4-hydroxystyrene; copolymers of 4-hydroxystyrene, for example with 3-methyl-4-hydroxystyrene or 4-methoxystyrene; copolymers of (meth) acrylic acid, for example with styrene; copolymers of maleiimide, for example with styrene; hydroxy or carboxy functionalised celluloses; dialkylmaleiimide esters; copolymers of maleic anhydride, for example with styrene; and partially hydrolysed polymers of maleic anhydride.

The coating is preferably patternwise solubilized by heat, during the pattern forming (exposure) process. In broad terms there are three ways in which heat may be patternwise delivered to the coating, in use, These are:

(1) Direct heat, i.e. the direct delivery of heat by a heated body, by conduction. For example the coating may be contacted by a heat stylus; or the reverse face of the substrate onto which the coating has been coated may be contacted by a heated body. A heated body may be a heat stylus.

(2) The use of incident electromagnetic radiation to expose the coating, the electromagnetic radiation being converted to heat, either directly or by a chemical reaction undergone by a component of the coating. The electromagnetic radiation could for example be IR, or UV or visible radiation, depending on the coating. Preferably it is IR.

(3) The use of charged-particle radiation, for example electron beam radiation. Clearly, at the fundamental level the charged-particle mode and the electromagnetic mode are convergent; but the distinction will be clear to those skilled in the art at the practical level.

The time and temperature conditions for the heat treatment procedure of the invention, carried out as part of the method of providing a printing form precursor, including of improving or reclaiming a precursor, may be contrasted with the delivery of heat during the later exposure process, for those preferred coatings which are heat sensitive, the latter delivery of heat being of very short duration and very high intensity. Nor is the heat treatment procedure of the invention to be confused with the heat treatment step whereby the wet coating applied to the substrate is heated to drive off solvent and leave a coating which is dry to the touch.

In patternwise exposing the precursor the use of electromagnetic radiation is preferred. To increase the sensitivity of the preferred heat sensitive coatings used in the present invention it is beneficial in embodiments intended for exposure using electromagnetic radiation to include an additional component, namely a radiation absorbing compound capable of absorbing the incident electromagnetic radiation and converting the radiation to heat (hereinafter referred to as a "radiation absorbing compound"). It may also be desirable to include a suitable radiation-absorbing compound in embodiments intended for exposure using charged particle radiation.

Preferred coatings intended to require electromagnetic radiation for exposure are such that the coating can be exposed by means of a laser under digital control. Preferably, such a laser emits radiation at above 450 nm, preferably above 500 nm, more preferably above 600 nm, and especially above 700 nm. Most preferably it emits radiation at above 800 nm. Suitably it emits radiation of wavelength below 1400 nm, preferably below 1300 nm, more preferably below 1200 nm.

Examples of lasers which can be used to expose coatings suitable for the method of the present invention include semiconductor diode lasers emitting at between 450 nm and 1400 nm, especially between 600 nm and 1200 nm. One example is the Nd YAG laser which emits at 1064 nm and another is the diode laser used in the Creo TRENDSETTER thermal image setter, which emits at 830 nm, but any laser of sufficient imaging power and whose radiation is absorbed by the coating to produce heat, may be used.

Preferably the radiation absorbing compound is one whose absorption spectrum is such that absorption is significant at the wavelength output of the radiation source, preferably laser, which is to be used in the patternwise exposure of precursors made by the method of this invention. Usefully it may be an organic pigment or dye. It may be a black body radiation absorber, such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich. It may be a dye or pigment of the squarylium, merocyanine, phthalocyanine, cyanine, indolizine, pyrylium or metal dithioline classes.

In preferred coatings intended to require infra-red radiation for patternwise exposure it is preferred that their developer solubility is not increased by incident UV or visible radiation, thus making handling of the compositions straightforward. Preferably such coatings do not comprise any UV or visible light sensitive components. However UV or visible light sensitive components which are not activated by UV or visible light due to the presence of other components, such as UV or visible light absorbing dyes or a UV or visible light absorbing topmost layer, may be present in such coatings.

Pigments are generally insoluble in the coatings and so comprise particles therein. Generally they are broad band absorbers, which are preferably able efficiently to absorb electromagnetic radiation and convert the radiation to heat over a range of wavelengths exceeding 200 nm in width, preferably exceeding 400 nm in width. Generally they are not decomposed by the radiation, and have no or insignificant effect on the solubility of the unheated coating in the developer. In contrast dyes are generally soluble in the coatings. Generally they are narrow band absorbers, typically able efficiently to absorb electromagnetic radiation and convert the radiation to heat only over a range of wavelengths typically not exceeding 100 nm in width, and so must be selected in view of the wavelength of the radiation which is to be used for imaging.

Suitably the radiation absorbing compound, when present, constitutes at least 0.25%, preferably at least 0.5%, more preferably at least 1%, most preferably at least 2%, preferably up to 25%, more preferably up to 20%, most preferably up to 15%, of the total weight of the coating. A preferred weight range for the radiation absorbing compound may be expressed as 0.25–25% of the total weight of the coating. More specifically, in the case of dyes the range may preferably be 0.25–15% of the total weight of the coating, preferably 0.5–8%, while in the case of pigments the range may preferably be 1–25%, preferably 2–15%. For pigments, 5–15% may be especially suitable. In each case the figures given are as a percentage of the total weight of the dried coating. There may be more than one radiation-absorbing compound. References herein to the proportion of such compound or compounds are to the total content of such compound or compounds.

A preferred heat sensitive coating preferably includes a modifying means for modifying the properties of the coating. Such a modifying means is preferably arranged to alter the developer solubility of the coating compared to when the modifying means is not present in the coating. The modifying means may be covalently bonded to a polymer of the coating or may be a compound which is not covalently bonded thereto.

The modifying means may be selected from:

(1) Functional groups as described in WO 99/01795 (incorporated herein by reference).

(2) Diazide moieties described in WO 99/01796 (incorporated herein by reference).

(3) Separate reversible insolubilizer compounds, not being diazide moieties, and described in WO 97/39894, WO 99/08879 and WO 99/21725 (all incorporated herein by reference). Examples described include nitrogen-containing compounds wherein at least one nitrogen atom is either quaternized or incorporated in a heterocyclic ring; or quaternized and incorporated in a heterocyclic ring. Examples of useful quarternized nitrogen containing compounds are triaryl methane dyes such as Crystal Violet (CI basic violet 3) and Ethyl Violet. WO 97/39894 describes lithographic printing applications and WO 99/08879 describes electronic part applications of this technology. WO 99/21725 describes improvements to this technology brought about by the use of certain developer resistance aids, notably siloxane compounds.

(4) Latent Bronsted acids, onium salts or acid generating compounds as described in patents mentioned above, for example U.S. Pat. Nos. 5,491,046 and 4,708,925, and EP 819980 (all incorporated herein by reference).

The preferred embodiments of the present invention involve the heat treatment of coatings which do not contain diazide moieties.

It is believed that the present invention may be applied with benefit to precursors with a wide range of imageable coatings; but particularly to such coatings for which patternwise exposure entails the delivery of heat to selected areas of the precursor; and especially to such coatings for which delivery of heat causes the solubility change not by irreversible chemical decomposition. In preferred compositions to which the present invention is applied heat imaging produces areas which have transient increased solubility in the developer. After an interval such areas may partially or wholly revert to their original, non-imaged level of solubility. Thus the mode of action of such preferred coatings does not require heat-induced breakdown of the modifying means but, more likely, the break-up of a physico-chemical complex, which can reform. Consequently, in such preferred embodiments the precursor is contacted with a developer within a time period of 20 hours or less of the exposure to imaging heat, preferably within about 120 minutes of exposure, and most preferably within 5 minutes of exposure.

A preferred coating to which the method of the present invention may advantageously be applied contains a reversible insolubilizer compound and, preferably, an infra-red absorbing compound; or a compound which functions as a reversible insolubilizer compound and as an infra-red absorbing compound. Examples are given in WO 97/39894, WO 99/08879 and WO 99/21725. The coatings and precursors described in WO 97/39894, WO 99/08879 and WO 99/21725 are preferred coatings and precursors to which the present invention may be applied.

Suitably a reversible insolubilizer compound, when present (whether or not also acting as a radiation absorbing compound) constitutes at least 0.25%, preferably at least 0.5%, more preferably at least 1%, and most preferably at least 2%; and preferably up to 15%, more preferably up to 25%, of the total weight of the coating.

An especially preferred coating to which the present invention may be applied thus comprises a coating as defined above, and, additionally, either an infra-red absorbing compound to convert infra-red radiation to heat and a reversible insolubilizer compound as described in WO 97/39894 and WO 99/08879; or an infra-red absorbing compound which converts infra-red radiation to heat and which also functions as a reversible insolubilizer compound. Suitably the coating additionally contains a developer resistance means as defined in WO 99/21725, suitably a siloxane, preferably constituting 1–10 wt % of the composition. Preferred siloxanes are substituted by one or more optionally-substituted alkyl or phenyl groups, and most preferably are phenylalkylsiloxanes and dialkylsiloxanes. Preferred siloxanes have between 10 and 100 repeat units of $—Si(R_1)(R_2)O—$. The siloxanes may be copolymerised with ethylene oxide or propylene oxide, or both. Other preferred siloxanes are described in WO 99/21725.

The coatings used in the invention may contain other ingredients such as stabilising additives, inert colorants, and additional inert polymeric binders as are present in many positive working coatings.

In certain embodiments of the invention an additional layer comprising a radiation-absorbing compound may be used. This multiple layer construction may provide routes to high sensitivity as larger quantities of absorber can be used without affecting the function of the image-forming layer. In principle any radiation absorbing material which absorbs sufficiently strongly in the desired band can be incorporated or fabricated in a uniform coating. Dyes, metals and pigments (including metal oxides) may be used in the form of vapor deposited layers. Techniques for the formation and use of such films are well known in the art, for example as described in EP-A-652483, incorporated herein by reference.

The precursor includes a substrate over which the coating is provided. The substrate may comprise a metal layer. Preferred metals include aluminum, zinc, copper and titanium.

The substrate may be arranged to be non-ink-accepting. The substrate may have a hydrophilic surface for use in conventional lithographic printing using a fount solution or it may have an ink-repelling surface suitable for use in waterless printing.

The substrate may be any type of substrate usable in printing. For example, it may comprise a cylinder or, preferably, a plate. The terms “printing form” and “printing form precursor” are used herein to cover such articles, irrespective of their shape. The term “printing form precursor” is used herein to denote articles as sold, ready to be imaged and developed; the term “printing form” denotes the imaged and developed articles, ready for printing.

For printing applications the substrate may be aluminum which has undergone the usual anodic, graining and post-anodic treatments well known in the lithographic art for enabling a radiation sensitive composition to be coated thereon and for its surface to function as a printing background. Another substrate which may be used in the present invention in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated may be used.

Preferred printing form precursors have a substrate which has a hydrophilic surface and an oleophilic ink-accepting coating.

As used herein, reference to a coating as “developer soluble” means that the coating is soluble in a selected developer, to an extent useful in a practical development process. Similarly, as used herein reference to a coating as “developer insoluble” means that the coating is not soluble in the selected developer, to an extent useful in a practical development process.

Thus in preferred embodiments a positive working pattern may be obtained after patternwise exposure and development of a printing form precursor which has been processed by the method of the present invention. The developer solubility of the coating after it has been subjected to heat during patternwise exposure is greater than the solubility of the corresponding unexposed coating. In preferred embodiments this solubility differential is increased by means of additional components or by resin modification, or both, as described herein, and in earlier patents and patent applications as described above. Preferably such measures reduce the solubility of the coating, prior to the patternwise exposure. On subsequent patternwise exposure the exposed areas of the coating are rendered more soluble in the developer than the unexposed areas. Therefore on patternwise exposure there is a change in the solubility differential of the unexposed coating and of the exposed coating. Thus in the exposed areas the coating is dissolved, to form the pattern.

The coated precursor produced by the method of the invention may in use be patternwise heated indirectly by exposure to a short duration of high intensity radiation transmitted or reflected from the background areas of a graphic original located in contact with the recording material.

The developer is dependent on the nature of the coating, but is preferably an aqueous developer. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably an aqueous developer is an alkaline developer containing one or more inorganic or organic metasilicates.

In accordance with a fifth aspect of the present invention there is provided a printing form precursor provided by (including reclaimed by) a method of the invention as previously defined.

In accordance with a sixth aspect of the present invention there is provided a method of improving the characteristics of a thermally imageable lithographic printing form precursor, the method comprising the steps of:

i) heating the thermally imageable precursor to an elevated temperature in the range 45–110° C.; and ii) accelerating the cooling of the heated precursor to 30° C. or below;

wherein prior to the execution of step i) the imaging characteristics of the thermally imageable precursor had become degraded.

A thermally imageable precursor requiring reclamation may have become degraded by chemical changes within the coating—for example due to storage at too high a temperature, or due to being stored for an excessive period prior to use—or by physical changes—for example due to rough handling or adverse effects caused by the stacking of the precursors in packets or stacks.

In accordance with a seventh aspect of the present invention there is provided a method of producing a printing form bearing a pattern in a coating thereon, from a printing form precursor as defined above in the fifth aspect of the present invention, comprising an exposure step to render exposed areas of the coating developer soluble, followed by development in a developer to remove the exposed areas. The exposure step preferably entails heating the areas. The heating of the areas may be effected as described above.

In accordance with an eighth aspect of the present invention there is provided a printing form bearing a pattern in a coating thereon, produced by the method of the seventh aspect of the invention, as defined above.

The following examples more particularly serve to illustrate the present invention described hereinabove.

EXAMPLES

In the following examples the substrate was a 0.3 mm thickness aluminum sheet electrograined and anodised and post-anodically treated with an aqueous solution of an inorganic phosphate. The coating solution contained the following components:

14 wt % LB6564-a phenol/cresol novolak resin marketed by Bakelite, UK, and believed to have the structure:

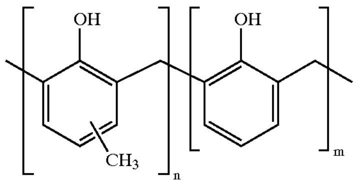

with n = m 4 wt % LB 744-a cresol novolak resin marketed by Bakelite, UK.

0.4 wt % KF654B PINA as supplied by Riedel de Haan UK, Middlesex, UK, and believed to have the structure:

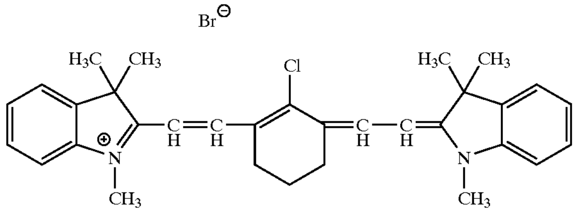

0.4 wt % crystal violet (basic violet 3, C.I. 42555, Gentian Violet) as supplied by Aldrich Chemical Company of Dorset, UK, and believed to have the structure:

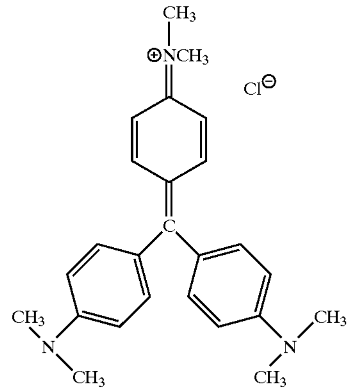

1.2 wt % Silikophen P50X: a phenyl methyl siloxane as supplied by Tego Chemie Service GmbH of Essen, Germany.

80 wt % 1-methoxypropan-2-ol/xylene (98:2 v:v)

The initial manufacture of the precursors was carried out as follows: the coating solution was reverse roller coated onto the substrate. The solution concentration had been selected to provide the dry coating with a coating weight of 2 $gm^{-2}$. After thorough drying at 110° C. for 30 seconds in a hot air displacement oven the substrate was wound up as a coil. The coil was cut to form individual precursors of size about 115 cm×92 cm, which were laid horizontally in stacks on pallets, typically with about 1500 precursors in a stack, and with an interleaving sheet between adjacent precursors. The interleaving sheets were a polythene coated paper No 22, 6 $gm^{-2}$, available from Samuel Grant, Leeds, UK. At both the top of the stack, 5 dummy precursors were placed. Four such stacks were made. The four stacks were then placed in an oven for 72 hours at 55° C. The oven was a 2.3 m×2.3 m×2.3 m oven recirculating warm air supplied by two fans via plenums on two sides of the oven. The recirculating volume was 5500 cubic feet per minute (2.6 $m^3$/second). At the end of this period the stacks were removed from the oven and put in ambient, still air to cool to ambient temperature.

The following examples employed samples of the precursors mentioned above which on manufacture had met our quality specification, but no longer did so. The quality specification selected was that when the imaged dot settings were 50% and the minimum power which could achieve clear imaging was 40 to 60% of the maximum power available from a Plate Rite 8000 imagesetter (from Dainippon Screen Mfg), the reproduced dot settings must be 46 to 50%, with the exposure being followed by processing on a PK-910 processor (from Kodak Polychrome Graphics, Gunma, Japan) at 30° C. for 25 seconds using PD-1 developer (available from Kodak Polychrome Graphics, Gunma, Japan) at a dilution of 1 part PD-1 to 5.6 parts water.

Example 1

Precursors manufactured as described above and which were once within the specification described above but which had been found to subsequently be outside that specification, were passed through a Wisconsin Corp. preheat oven one by one. A "heat shock" of 21 seconds duration was given to each precursor by means of hot air blowing onto it. The temperature of the hot air was varied between 90° C. and 110° C. After passing through the oven each precursor was cooled by leaving it in ambient, still air. The period to cool each precursor to 30° C. or less was less than 10 minutes. The precursors were then exposed to IR radiation on the Plate Rite 8000 image setter and developed in the PK-910 processor at 30° C. for 25 seconds using PD-1 developer diluted 1/5.6 in water. In a series of imaging steps using different power levels (5% gradations) the minimum power to fully expose the precursor was determined, that is, to achieve clearness in the exposed areas. This is described on the Plate Rite 8000 image setter as "% of the maximum power". Once this power level was ascertained a 50% "checkerboard pattern" was exposed on the precursor, at that power level. The actual dot sizes after development were then measured using a standard densitometer.

One aspect of the quality specification is that minimum power % should be within defined limits. FIG. 1 shows the relationship between the minimum power as a percentage of the image setter's maximum power, at which clear image areas were obtained. The quality specification for an acceptable precursor is 40% to 60%. In relation to this property an oven setting of 90 to 110° C. and a heating duration of 21 seconds was effective in achieving this, in this example.

Another aspect of the quality specification for an acceptable precursor is 46 to 50% reproduced dots following the 50% "checkerboard pattern" exposure at the minimum power level. For the experiments described above FIG. 2 shows the relationship between the reproduced dot % following 50% dot exposure with the hot air applied being from 90° C. to 110° C. and the heating duration being 21 seconds. The 90 to 105° C. oven settings were effective into bringing precursors back within the quality specification.

Figure 2:
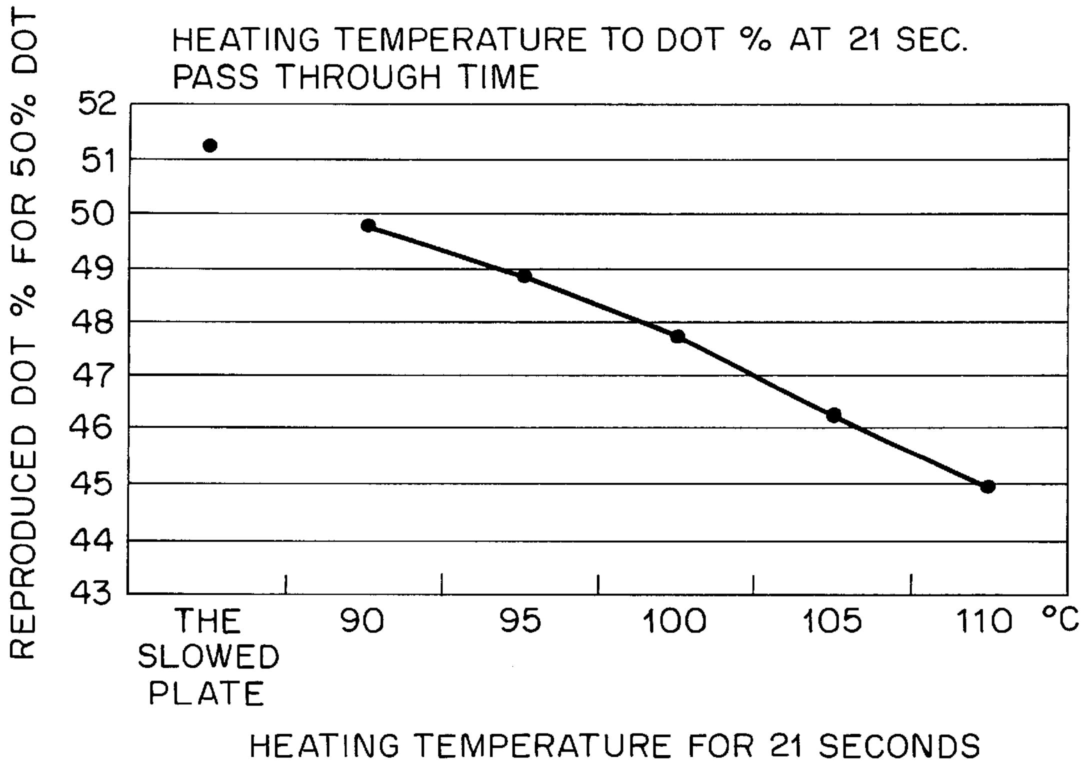
FIG. 2 depicts the relationship between reproduced dot % (following 50% dot exposure) vs. heating temperature (for 21 seconds).

It should be noted that in FIGS. 1 and 2 the "heating temperature" shown denotes the air temperature setting on the Wisconsin pre-heat oven; the temperature of the precursors themselves was not measured.

Example 2

In this example the slowed precursors were passed one by one through a Compact Thermal Processing machine, available from Kodak Polychrome Graphics. The technology is described in PCT/US00/27162. The machine has a temperature-controlled heating chamber containing ceramic lamps above and below the pathway for a precursor. When a slowed precursor passed through in the heating chamber, the precursor received a "heat shock". Precursors were passed through in the heating chamber of the machine, set at 150° C., with the time within the heating chamber set for 68, 38 and 21 seconds. The precursors were cooled by leaving them to stand individually for 10 minutes in ambient, still air, during which time they cooled to 30° C. or less. The precursors then were imaged, developed and tested as described in Example 1. The results are shown in Table 1 below:

TABLE 1

| Condition | Repro. Dot % | Min. power % |
|---|---|---|
| Slowed precursor | 52.1% | 70% |
| 68 sec. at 150° C. setting | 49.8% | 50% |
| 38 sec. at 150° C. setting | 48.0% | 40% |
| 21 sec. at 150° C. setting | 46.3% | 40% |

In each case the precursors given the heat treatment gained in operating speed and came back within the quality specification.

Example 3

10 precursors were interleaved with aluminum laminated paper, wrapped in more of the same paper and sealed with adhesive tape to form packets. The packets were put into a so-called "burning oven", available from Koyo Chemical Industry Corp. This was used in this example as a moderate heating oven, set at 65° C. The packets were taken out of the oven successively after ½, 1, 2, 4, 8 and 16 hours of heating. The packets were allowed to cool by leaving them in ambient, still air. 20 minutes was found to be sufficient for them to cool to 30° C. or less. Sample precursors were evaluated in the same manner as described in Example 1. The results are shown in Table 2 below:

TABLE 2

| Condition | Repro. Dot % | Min. power % |
|---|---|---|
| Slowed precursor | 50.6% | 65% |
| ½ hr at 65° C. setting | 47.0 | 40% |
| 1 hr at 65° C. setting | 46.8% | 40% |
| 2 hr at 65° C. setting | 46.0% | 40% |
| 4 hr at 65° C. setting | 47.2% | 41% |
| 8 hr at 65° C. setting | 48.2% | 45% |
| 16 hr at 65° C. setting | 49.8% | 50% |

It can be seen that between ½ to 16 hours heating, the slowed precursors came back into specification. The results for the longer heating times, at which some slowing of the precursor was evident, suggested that there may be heating regimes that are of too long a duration, such that precursors are again approaching being outside the quality specification. Accordingly, there may be an "operating window", for best results.

Example 4

Five hundred slowed precursors were piled into a stack and wrapped with plastic sheet. The stack was set on a pallet and carried into a conditioning oven, available from Pladrest Heating Limited. The oven was heated up and the temperature was kept at 62° C. for 2 hours. Then, the pallet was carried out of the oven and immediately transferred into a cooling chamber able to provide a controlled environment, available from Yamoto Science Co. Ltd. This was held at 5° C. for 6 hours, during which time the temperature of the stack came down to 30° C. or less. Samples from the upper region, middle region and bottom region of the stack were evaluated in the manner described above. The results are shown in Table 3 below:

TABLE 3

| Condition | Repro. Dot % | Min. power % |
|---|---|---|
| Slowed precursor | 51.0% | 90% |
| Sample from upper region | 47.4% | 45% |
| Sample from middle region | 49.3% | 45% |
| Sample from bottom region | 48.0% | 45% |

Thus, by means of the heat treatment all of the slowed precursors became faster and came back into specification.

Example 5

Five hundred slowed precursors were piled into a stack and wrapped with plastic sheet. The stack was set on a pallet. Two such pallets were carried into the Pladrest conditioning oven. The oven was heated to 62° C., then the temperature was held at 62° C. for 8 hours. Then, one pallet was removed from the oven and immediately transferred into the Yamoto Science cooling chamber mentioned in Example 4. This was held at 5° C. for 6 hours, during which time the temperature of the stack came down to 30° C. or less. The other pallet was taken out of the Pladrest oven and allowed to cool in ambient, still air. It took 12 hours to reach 30° C. or less. Precursor samples taken from the bottom region of each stack were evaluated in the same manner as before. The results are shown in Table 4 below:

TABLE 4

| Condition | Repro. Dot % | Min. power % |
|---|---|---|
| Slowed precursor | 51.7% | 95% |
| Cooled in ambient, still air (12 hrs) | 50.4% | 75% |
| Cooled at 5° C. (6 hrs) | 48.2% | 45% |

Accelerated cooling at 5° C. gave precursors within the quality specification; cooling in ambient, still air did not.

The invention is not restricted to the details of the foregoing embodiments. The invention extends to any feature, or any combination, of the features disclosed in this specification (including any accompanying claims, abstract and drawings), or to any step, or any combination of the steps of any method or process so disclosed.

We claim:

1. A method of preparing a printing form precursor or precursor web comprising:

(a) providing a precursor or precursor web comprising a positive working imageable coating on a substrate, wherein the coating comprises a polymeric composition;

(b) subjecting the precursor or precursor web to a heat treatment at an elevated temperature; and (c) cooling the precursor more quickly than by placing the precursor in ambient, still air.

2. The method of claim 1, wherein the polymeric composition includes hydroxyl groups.

3. The method of claim 2, wherein the polymeric composition includes a phenolic resin or a poly(hydroxystyrene) resin.

4. The method of claim 2, wherein the polymeric composition includes a novolak resin.

5. The method of claim 1, wherein the precursor or precursor web is subjected to the heat treatment for not more than 8 hours.

6. The method of claim 1, wherein the precursor or precursor web is cooled to 30° C. or less in not more than 1 hour.

7. The method of claim 1, wherein a packet of 2 to 50 precursors, is subjected to the heat treatment for not more than 20 hours.

8. The method of claim 1, wherein a packet of 2 to 50 precursors, is cooled to a temperature of 30° C. or less in not more than 5 hours.

9. The method of claim 1, wherein a stack of more than 50 precursors, is subjected to the heat treatment for not more than 20 hours.

10. The method of claim 1, wherein a stack of more than 50 precursors is cooled to a temperature of 30° C. or less in not more than 8 hours.

11. The method of claim 1, further comprises patternwise exposing the imageable coating to direct heat.

12. The method of claim 1, further comprising patternwise exposing the imageable coating to charged particle radiation or electromagnetic radiation.

13. The method of claim 12, wherein the imageable coating is patternwise exposed to electromagnetic radiation, and the coating comprises a radiation-absorbing compound able to absorb electromagnetic radiation in the range of 600 to 1400 nm.

14. The method of claim 1, wherein the imageable coating comprises an insolubilizer.

15. The method of claim 1, wherein the precursor is cooled to 30° C. or less at least 20% more quickly than by placing the precursor in ambient, still air.

16. The method of claim 1 further comprising patternwise exposing the imageable coating to radiation to form an imaged coating, wherein exposed portions of the imageable coating are more developable in a developer liquid than unexposed portions.

17. The method of claim 16 further comprising contacting the imaged coating with a developer liquid to form an image.

18. A method of reclaiming a precursor having a defective positive working imageable coating on a substrate, the coating comprising a polymeric composition, wherein the method comprises subjecting the precursor to an elevated temperature followed by cooling the precursor more quickly than by placing the precursor in ambient, still air.

19. A method of preparing a thermally imageable lithographic printing form precursor having degraded imaging characteristics, the method comprising:

(a) heating the thermally imageable precursor to an elevated temperature in the range of 45–110° C.; and (b) cooling the heated precursor to 30° C. or less more quickly than by placing the precursor in ambient, still air.

20. A method of preparing a printing form precursor, precursor web or packet of precursors, the method comprising:

(a) providing a precursor, precursor web or packet of precursors comprising a positive working heat imageable coating on a substrate, the coating comprising a polymeric composition which includes hydroxyl groups, an insolubilizer, and a radiation absorbing compound able to absorb electromagnetic radiation in the range 600 to 1400 nm;

(b) heating the precursor, precursor web or packet of precursors at an elevated temperature for not more than 5 hours; and (c) cooling the precursor, precursor web or packet of precursors to 30° C. or less in not more than one hour and more quickly than by placing the precursor, precursor web or packet of precursors in ambient, still air.

21. A method of preparing a stack of printing form precursors, the method comprising:

(a) providing a stack of printing form precursors, each precursor comprising a positive working heat imageable coating on a substrate, the coating comprising a polymeric composition which includes hydroxyl groups, an insolubilizer, and a radiation absorbing compound able to absorb electromagnetic radiation in the range 600 to 1400 nm;

(b) subjecting the stack to an elevated temperature for not more than 8 hours; and (c) cooling the stack to a temperature of 30° C. or less in not more than 8 hours and more quickly than by placing the precursor in ambient, still air.

* * * * *

UNITED STATES PATENT AND TRADEMARK OFFICE

CERTIFICATE OF CORRECTION

PATENT NO. : 6,723,489 B2
DATED : April 20, 2004
INVENTOR(S) : Maru Aburano et al.

It is certified that error appears in the above-identified patent and that said Letters Patent is hereby corrected as shown below:

Title page,
Item [73], Assignee, delete "LLP" and insert therefor -- LLC --

Column 18,
Line 21, delete "comprises" and insert therefor -- comprising --

Signed and Sealed this

Twentieth Day of July, 2004

JON W. DUDAS
*Acting Director of the United States Patent and Trademark Office*